United States Patent [19]
Tavana

[11] Patent Number: 5,504,439
[45] Date of Patent: Apr. 2, 1996

[54] I/O INTERFACE CELL FOR USE WITH OPTIONAL PAD

[75] Inventor: Danesh Tavana, Mountain View, Calif.

[73] Assignee: Xilinx, Inc., San Jose, Calif.

[21] Appl. No.: 484,064

[22] Filed: Jun. 6, 1995

Related U.S. Application Data

[62] Division of Ser. No. 221,679, Apr. 1, 1994.

[51] Int. Cl.$^6$ ............................................. H03K 19/177
[52] U.S. Cl. ............................. 326/38; 326/41; 326/101
[58] Field of Search .................................. 326/38, 39, 40, 326/41, 101; 340/825.79, 825.83, 825.85, 825.86, 825.87; 364/716

[56] References Cited

U.S. PATENT DOCUMENTS

| | | | |
|---|---|---|---|
| Re. 34,363 | 8/1993 | Freeman | 326/41 |
| 4,124,899 | 11/1978 | Birkner et al. | 364/716 |
| 4,706,216 | 11/1987 | Carter | 365/94 |
| 4,750,155 | 6/1988 | Hsieh | 365/203 |
| 4,758,745 | 7/1988 | Elgamal et al. | 326/41 |
| 4,758,746 | 7/1988 | Birkner et al. | 326/40 |
| 4,821,233 | 4/1989 | Hsieh | 365/203 |
| 4,870,302 | 9/1989 | Freeman | 326/41 |
| 4,937,475 | 6/1990 | Rhodes et al. | 326/41 |
| 5,023,606 | 6/1991 | Kaplinsky | 340/825.8 |
| 5,148,390 | 9/1992 | Hsieh | 365/95 |
| 5,198,705 | 3/1993 | Galbraith et al. | 326/37 |
| 5,243,238 | 9/1993 | Kean | 326/41 |
| 5,258,668 | 11/1993 | Cliff et al. | 326/41 |
| 5,260,611 | 11/1993 | Cliff et al. | 326/39 |
| 5,260,881 | 11/1993 | Agrawal et al. | 364/489 |
| 5,267,187 | 11/1993 | Hsieh et al. | 364/784 |
| 5,280,202 | 1/1994 | Chan et al. | 326/37 |
| 5,317,210 | 5/1994 | Patel | 326/40 |
| 5,317,698 | 5/1994 | Chan | 395/325 |
| 5,341,044 | 8/1994 | Ahanin et al. | 326/41 |
| 5,349,248 | 9/1994 | Parlour et al. | 326/38 |
| 5,424,589 | 6/1995 | Dobbelaere et al. | 326/41 |
| 5,450,021 | 9/1995 | Chiang | 326/39 |

FOREIGN PATENT DOCUMENTS

WO93/05577  8/1992  WIPO.

OTHER PUBLICATIONS

"The Programmable Logic Data Book", 1993, pp. 1-1 through 1-7; 2-1 through 2-42; 2-97 though 2-130; and 2-177 through 2-204, available from Xilinx, Inc., 2100 Logic Drive, San Jose, California 95124.

"Xilinx Programmable Gate Array Book", 1989, pp. 6-30 through 6-44, available from Xilinx, Inc., 2100 Logic Drive, San Jose, California 95124.

Morales, Luis, "Boundry Scan in XC4000 Devices", XAPP 017.001, Oct. 1992, pp. 1 through 19.

Weste et al., "CMOS VLSI Design, A Systems Perspective", 1985 by A, T&T Bell Laboratories, Inc., pp. 224–230.

Primary Examiner—Edward P. Westin
Assistant Examiner—Benjamin D. Driscoll
Attorney, Agent, or Firm—Edel M. Young

[57] ABSTRACT

In a programmable integrated circuit device, a pad interface structure is provided in which the number of pads connected to the interface structure is selectively changed without redesigning the interface structure or redesigning the chip interior.

1 Claim, 5 Drawing Sheets

I/O INTERFACE CELL FOR USE WITH OPTIONAL PAD

This application is a division of application Ser. No. 08/221,679, filed Apr. 1, 1994.

CROSS-REFERENCE TO RELATED APPLICATIONS

This application relates to the following concurrently filed and commonly assigned co-pending U.S. patent applications:

1. Ser. No. 08/222,138 invented by Danesh Tavana, Wilson K. Yee, and Victor A. Holen entitled "TILE BASED ARCHITECTURE FOR FPGA", 2. Ser. No. 08/223,391 invented by Wilson K. Yee entitled "FIELD PROGRAMMABLE GATE ARRAY PROVIDING CONTENTION FREE CONFIGURATION AND RECONFIGURATION", 3. Ser. No. 08/223,083 invented by Wilson K. Yee entitled "A PROGRAMMABLE SCAN-CHAIN TESTING STRUCTURE AND METHOD", 4. Ser. No. 08/223,247 invented by Lawrence C. Hung and Charles R. Erickson entitled "A PROGRAMMABLE LOGIC DEVICE INCLUDING A PARALLEL INPUT DEVICE FOR LOADING MEMORY CELLS", and 5. Ser. No. 08/222,141 invented by Lawrence C. Hung entitled A PROGRAMMABLE LOGIC DEVICE WITH PARTIALLY CONFIGURABLE MEMORY CELLS AND A METHOD FOR CONFIGURATION",
all of which are incorporated herein by reference.

FIELD OF THE INVENTION

The invention relates to input/output pad structures for integrated circuit devices, and more particularly to pad-limited integrated circuit devices.

BACKGROUND OF THE INVENTION

Pads are metal contacts usually at the perimeter of a device which are manufactured as part of the integrated circuit device and connected to selected internal wires. Metal wires or tape automated bonding lines are bonded to the pads to connect the integrated circuit device to external pins. Internal components of IC devices, such as transistors, metal lines, and vias, are increasingly becoming smaller. However, the size of the pads has not shrunk comparably to the sizes of these internal components. Thus many IC devices are pad limited, i.e. cannot become smaller in area irrespective of the shrinkage of internal components because the number and size of the pads require that the circuit be of a given size.

To minimize total chip area, pads are sometimes eliminated. If enough pads are eliminated, the device can be made smaller, but may have reduced functionality. Moreover, removing pads in a conventional field programmable gate array (FPGA) device is not a trivial task, and typically requires a new layout of the device, or even architectural changes. The physical layout dependence between pads and logic elements remains a significant impediment to technology migration (downward scaling of geometries) since pad sizes don't shrink in correspondence to logic cell sizes and line widths.

FPGAs provide routing interconnect lines for connecting logic elements to pads and for interconnecting logic elements. Thus, routing congestion occurs at the perimeter of the chip due to routing signals between pads and the logic elements as well as routing signals in the interior of the chip between logic elements.

SUMMARY OF THE INVENTION

The present invention provides a pad interface cell between the pads and the logic cells of an integrated circuit device. The interface cell allows pads to be added to or removed from a design easily, and allows certain interconnect lines to be used for routing when no pad is present and to connect to a pad or pads if a pad is present.

With the present invention, when design rules shrink, only minor changes need be made at the periphery of the pad interface to remove connections to eliminated pads. There is no need for major redesign of the layout.

In one embodiment, the pad interface cell comprises a plurality of matrix interconnect lines which are crossed by a plurality of logic cell input and output lines and by lines for connecting the matrix interconnect lines of one cell to corresponding matrix interconnect lines of at least one other cell. Means are provided for connecting several pads to the matrix interconnect lines. In one embodiment, the means includes tristate buffers.

DETAILED DESCRIPTION OF SOME EMBODIMENTS

Figure 1A:
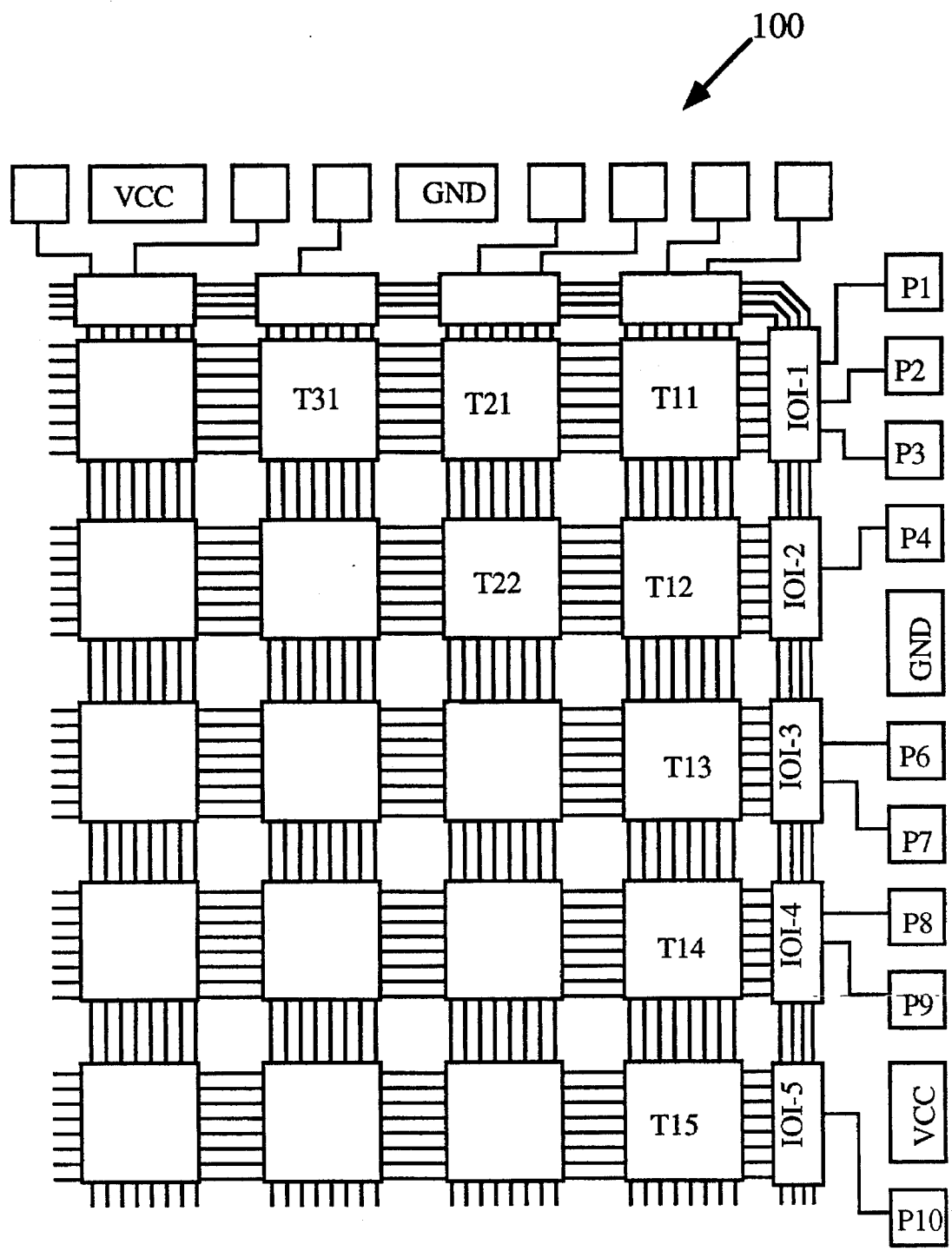
FIGS. 1A and 1B show two cell portions, differing in the size of logic cells, number of pads provided, and pad connections.

FIG. 1A shows a portion of a representative logic device 100 having logic elements or tiles such as T11, T12. In one embodiment, the FPGA combines logic elements which perform a programmable function with programmable routing. Detail of these tiles is described in concurrently filed copending patent application Ser. No. 08/222,138. Logic device 100 further includes pads such as P1 through P10 for providing input and output signals and power and ground pads VCC and GND for providing power to the integrated circuit device. Power and ground pad connections to the interior of logic device 100 are well known to those skilled in the art, and therefore are not shown in FIG. 1A.

According to the invention, an input/output interface structure is provided between the pads and the internal logic elements. Specifically, the interconnect structure comprises a plurality of input/output interface cells such as IOI-1 through IOI-5, each connectable to predetermined logic elements T11 through T15, and to adjacent interface cells. They are further connectable, simply by changing a metal mask, to several adjacent pads. In one embodiment, each interface cell IOI-1, IOI-2, etc. is connectable at the mask design stage to up to four pads.

Because the interface cells are programmably connectable to each other, it is possible to connect any pad to its corresponding interface cell and through the interface structure to any one of a plurality of tiles interior to the array. This structure has the advantage that if the relative size of the tiles such as T11 and the interface cells such as IOI-1 changes with respect to the relative size or position of the pads, the layout of the new design requires a change only in the connections from the interface structure to the pads. Furthermore, the interface structure allows for additional programmable wiring, for example from one pad to another pad, or from one logic element to another logic element.

Referring to FIG. 1A, pads P1, P2, and P3 are connected to input/output interface cell IOI-1. Pad P4 is connected to interface cell IOI-2. In another embodiment of the present invention shown in FIG. 1B, pad P3 is removed, thereby leaving interface cell IOI-1 connected to only two pads, P1 and P2. Note that the sizes of the logic tiles and interface structures have been shrunk with respect to FIG. 1A, but that the size of the pads has not been shrunk. The ease of this adjustment will be further understood from FIGS. 2A and 2B below.

Figure 1B:
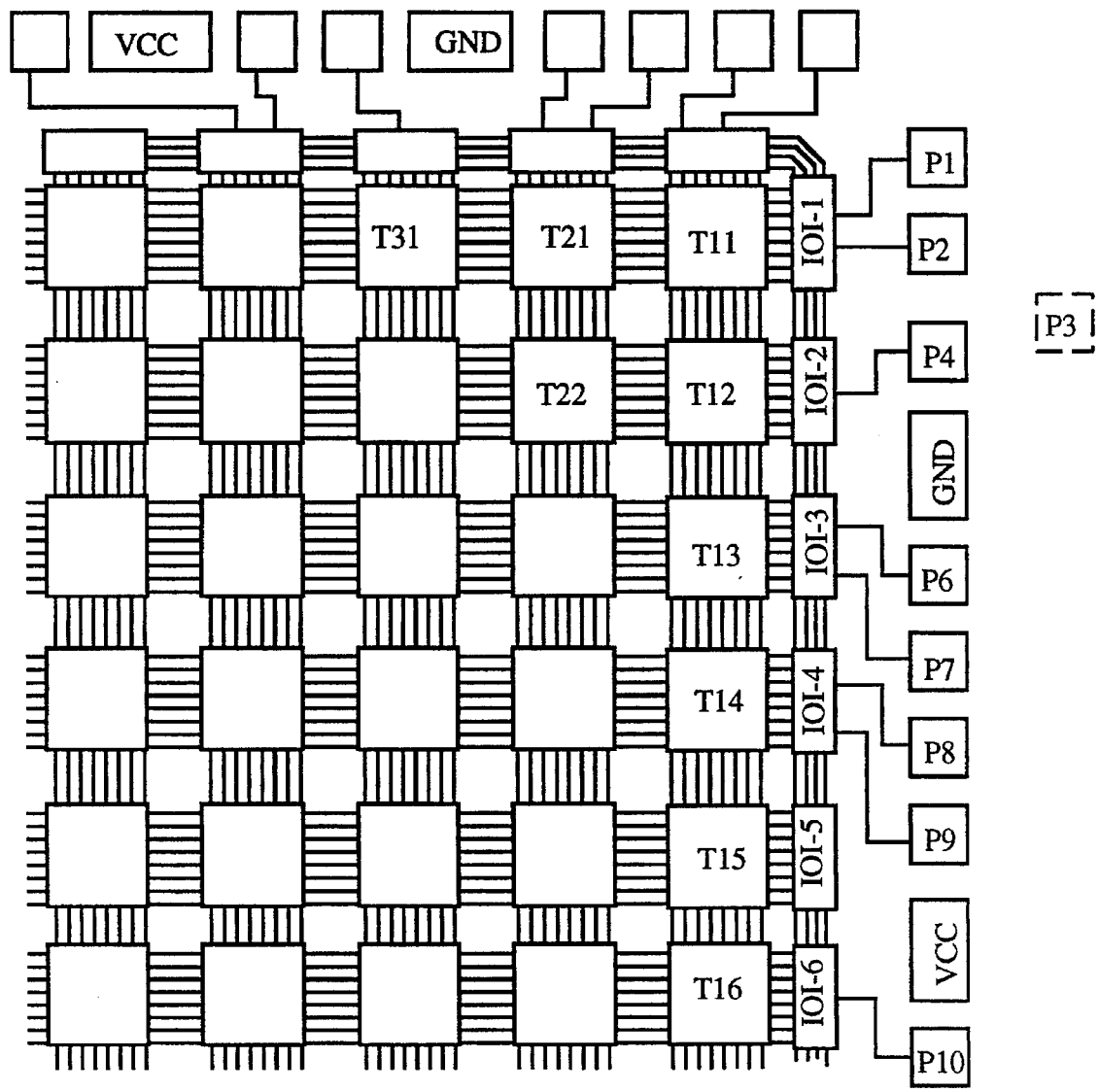

As a second change in converting to FIG. 1B, Pad P10 is connected to interface IOI-6, whereas in FIG. 1A, pad P10 was connected to interface cell IOI-5. By taking advantage of the connection means within the interface cells, pad P10 can still be connected to logic cell T15 and others, if desired.

Figure 2A:
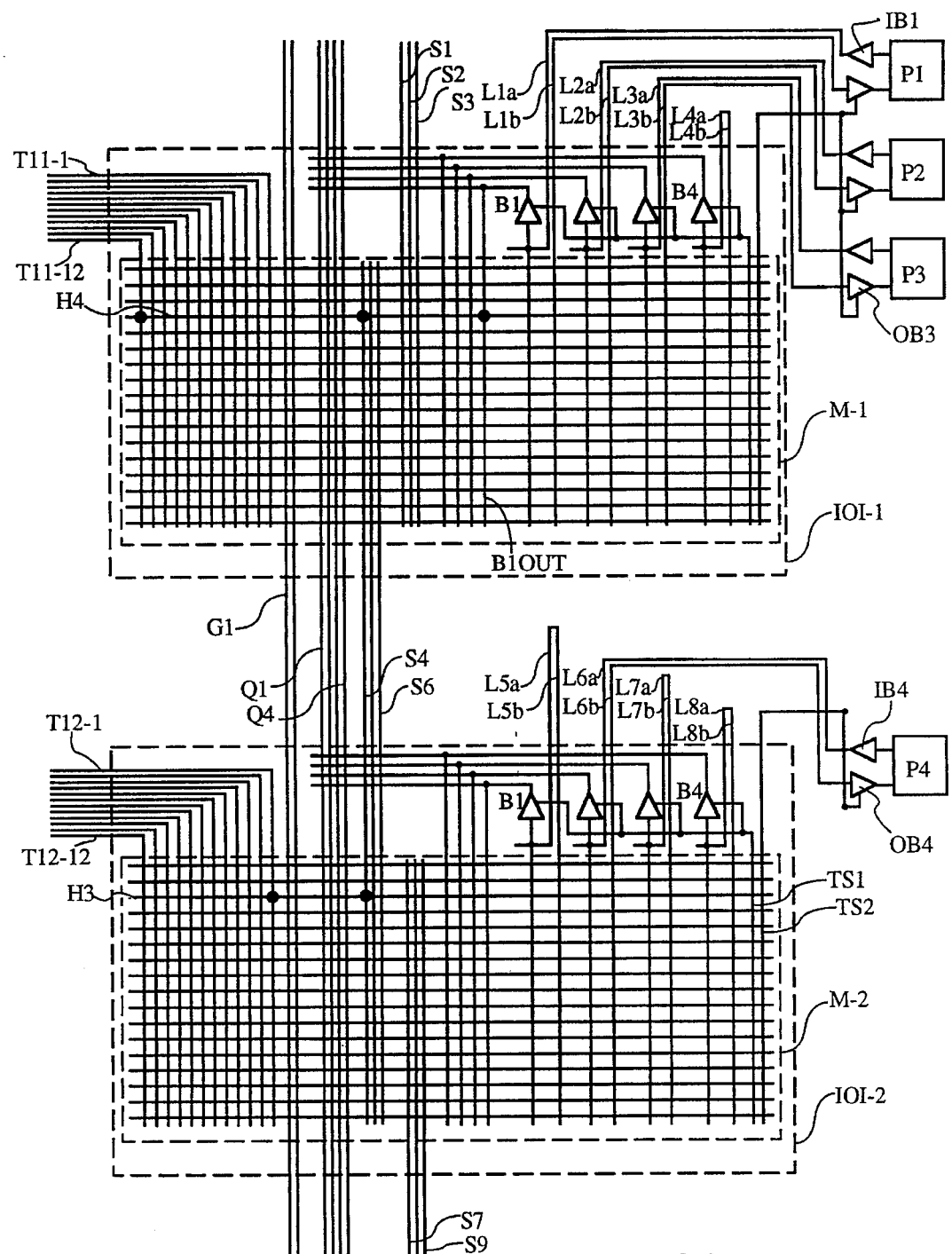
FIGS. 2A and 2B show two embodiments of the same pad interface, differing in the number of pads to which they connect.

FIG. 2A shows in detail one embodiment of the interface structure. In FIG. 2A are interface cells IOI-1 and IOI-2 (FIGS. 1A and 1B). In this embodiment, lines T11-1 through T11-12 and T12-1 through T12-12 at the left of interconnect matrices M-1 and M-2 extend to the left to connect to logic cells T11 and T12, as shown in FIGS. 1A and 1B. Lines extending between adjacent interconnect cells IOI-1 and IOI-2 include short lines S1 through S9 that extend between two adjacent interconnect cells only, and longer lines, for example lines Q1 through Q4, that extend the length of several interface cells. In one embodiment, long lines Q1 through Q4 extend the length of the chip thereby providing fast connection means for routing signals from one side of the chip to the other. In this embodiment, a global line G1 extends through both the core tiles such as T11 and the entire ring of interface cells such as IOI-1 in a chip, for distributing global signals such as clock and reset signals.

Selected intersections of horizontal and vertical line segments within the boundaries of interconnect matrices M-1 and M-2 include programmable interconnections, which may be formed from N-channel MOS transistors or antifuses, for example. By selectively programming the programmable interconnections, a user creates a path from a pad to any of the internal logic elements. For example, referring to FIG. 2A, to connect pad P1 to line T11-12, (which leads to logic element T11 and other logic elements T21 and T31 in the same row) the programmable interconnect point between the vertically extending output line B1OUT from buffer B1 of matrix M-1 and horizontal line H4 of matrix M-1 is programmed to form an interconnection, and the intersection between horizontal line H4 and vertical line T11-12 is programmed (see black dots showing programmed connection). With these two connections, a path is formed from pad P1 through input buffer IB1, through buffer B1 of matrix M-1, through the first interconnection point, onto horizontal line H4 of matrix M-1, through the second interconnection point, and onto line T11-12.

If it is desirable to connect pad P1 to line T12-1 leading to logic elements T12, T22 and others, horizontal line H4 is connected to short segment S4, short segment S4 is connected to, for example, horizontal segment H3 in matrix M-2, and horizontal segment H3 is connected to vertical line T12-1 leading to logic element T12. For this connection from pad P1 to line T12-1, the path goes through input buffer IB1, through buffer B1 of matrix M-1, through the first interconnection point, onto horizontal line H4, through a second interconnection point to vertical short segment S4, through a third interconnection point to horizontal segment of matrix M-2 and onto segment T12-1 leading to logic element T12. Thus it can be seen that the interconnect cells such as shown in FIGS. 2A and 2B allow for programmable connection between pads in one part of the integrated circuit and logic elements in any other part of the circuit.

Figure 2B:
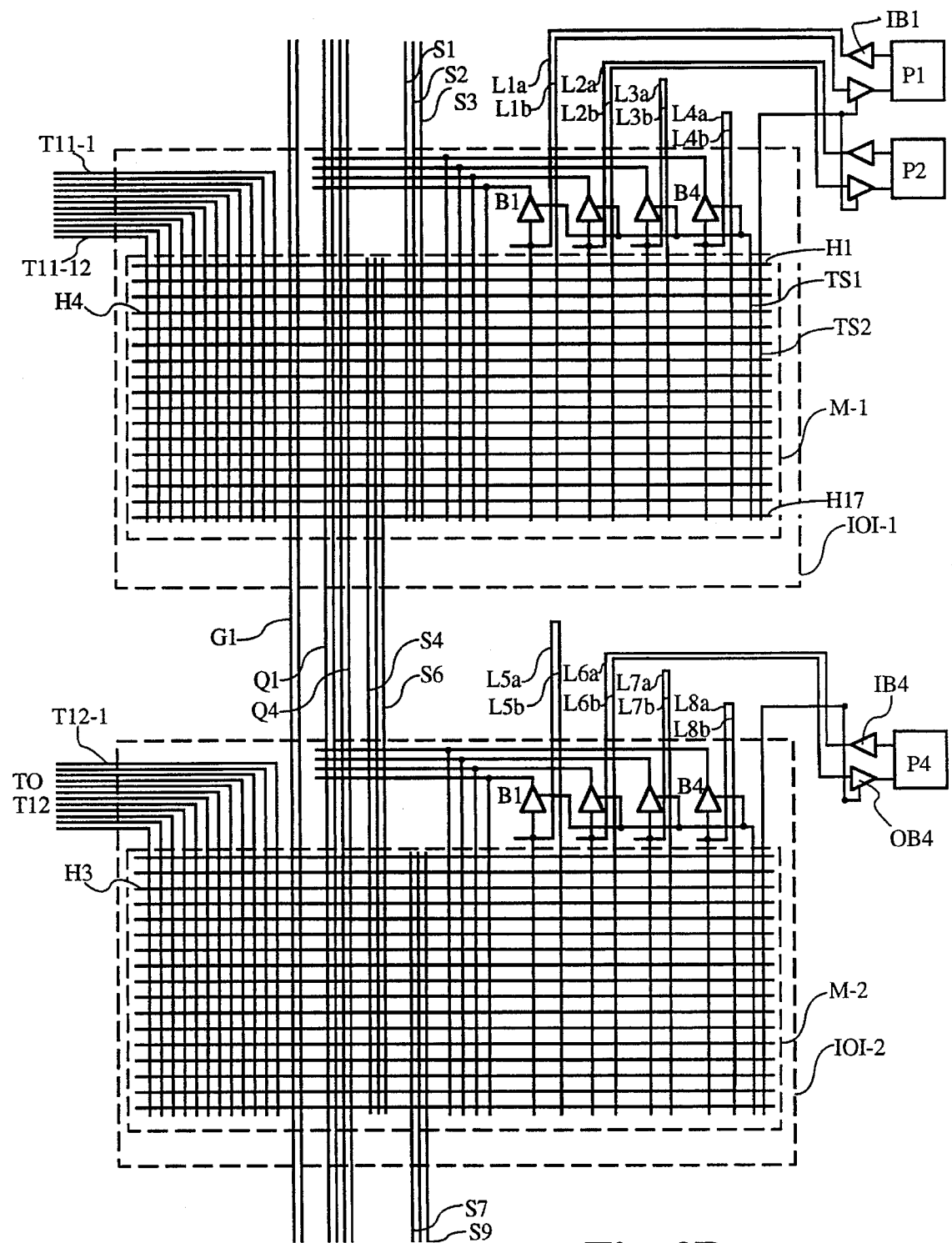

In the embodiments of the present invention shown in FIGS. 2A and 2B, the interiors of cells IOI-1 and IOI-2 are identical. However, if a design shrink occurs as assumed in FIG. 2B, the only necessary layout change between FIG. 2A and FIG. 2B (other than the shrink of logic elements T11, T12, etc. explained in detail in reference to FIG. 1B) is the number of pads and their connection to matrices M1 and M2. Specifically referring to FIG. 2A, pads P1, P2, and P3 are connected to interconnect matrix M-1 through lines L1a, L1b, L2a, L2b, L3a, and L3b, subscript "a" referring to input lines and subscript "b" referring to output lines. In this embodiment, lines L4a and L4b are shorted together, thereby providing further routing options in interconnection matrix M-1. In the interface cell IOI-2, only one pad, P4, is connected to interconnect matrix M-2 through lines L6a and L6b.

In FIG. 2B pad P3 is eliminated. Removal of pad P3 requires only the elimination of the pad from the pad mask area and shorting together lines L3A and L3B (instead of connecting these lines to pad P3 as was done in FIG. 2A). Thus, the amount of change in layout of a chip made to implement the circuit of FIG. 2B and one already previously designed to implement the circuit of FIG. 2A is quite small.

Interface cells IOI-1 and others in the interface system provide several additional advantages. Logic cells are selectively connected to each other either through short lines, such as lines S1 through S9, or through longer length lines, such as lines Q1–Q4. Alternatively or additionally, pads may be connected to each other through these same lines.

As a further advantage, buffers B1 through B4, which are controlled by high-impedance-control line TS1, may be controlled through one of the horizontal lines H1 through H17 to apply buffer output signals to other selected horizontal lines H1 through H17 and thence to vertical lines such as Q1 through Q4. By similarly connecting buffers B1 through B4 to lines Q1 through Q4 which extend to adjacent interface cells, and using tristate control line TS1 in each of the adjacent interface cells to provide an enable signal for a bus control line, lines Q1 through Q4 then serve as a bus. In other embodiments, lines of other lengths and/or numbers of tristate buffers are provided.

Figure 3:
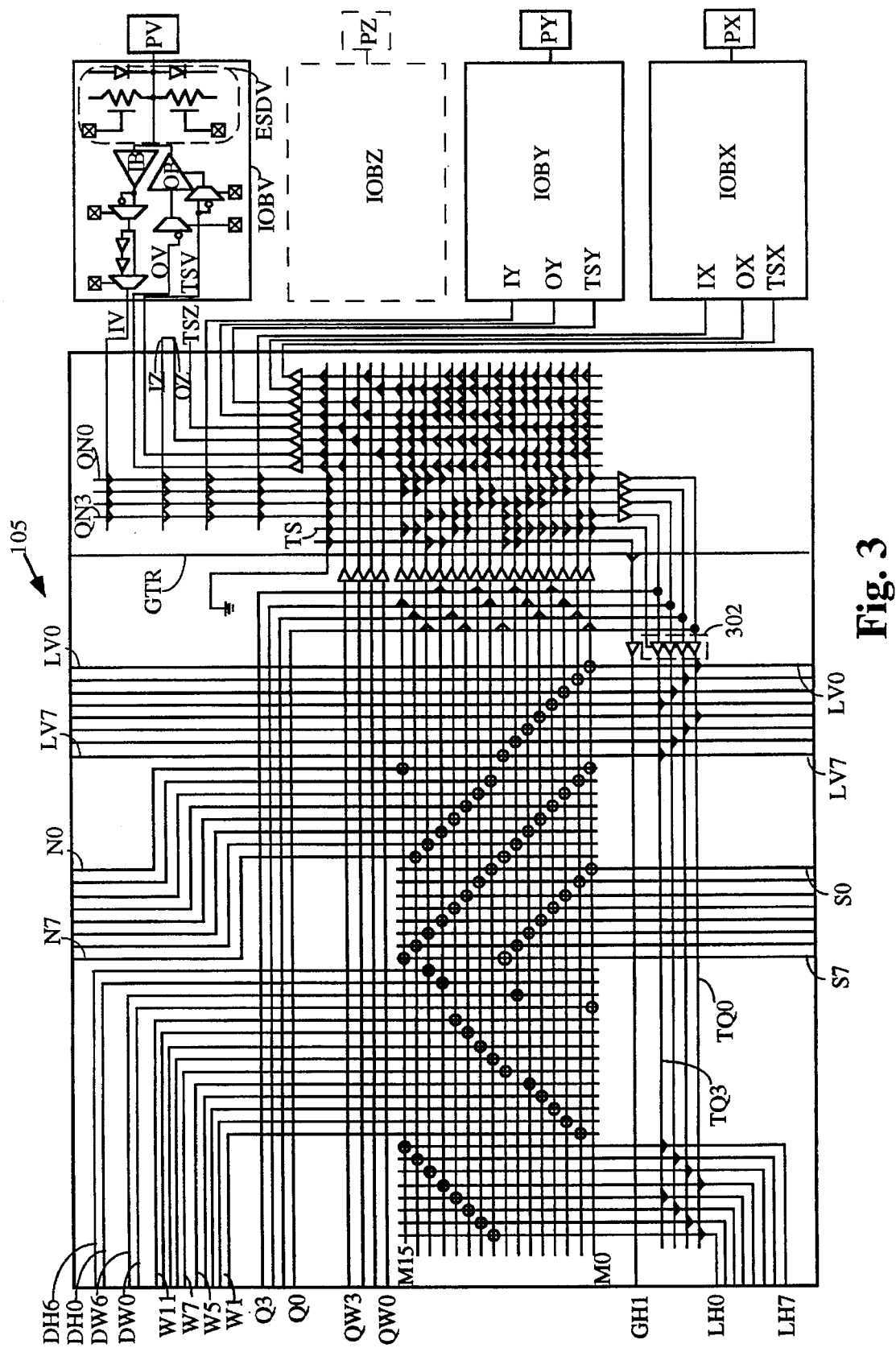
FIG. 3 illustrates a tile-based embodiment of a pad interface structure which can be connected to identical structures above and below.

FIG. 3 shows a structure according to one embodiment of the invention. In this embodiment, four pads PV, PZ, PY, and PX and related input/output buffer structures IOBV, IOBZ, IOBY, and IOBX are shown adjacent and to the right of input/output interface structure 105. However, as indicated by the dashed lines, pad PZ and input/output buffer structure IOBZ are not connected to interface structure 105, and in fact are not provided in the actual chip. Input line IZ and output line OZ are connected together, and tristate control line TSX is left unconnected.

Input/output buffer structure IOBV is shown in detail and includes an electrostatic discharge protection structure ESDV, input and output buffers IB and OB, and multiplexers for selecting polarity and amount of delay. Commonly owned copending patent application Ser. No. 08/058,189 describes an ESD protection circuit appropriate for this use and is incorporated herein by reference.

Interface structure 105 connects to other tiles (not shown), just as interface structures IOI-1 through IOI-6 of FIG. 1B connect to tiles T11 through T16, respectively. In the drawing of FIG. 3, lines which extend to the top, left, and bottom edges of interface structure 105 abut with lines on neighboring tiles. Interface structure 105 includes two representations of programmable interconnection points. Small open circles represent programmable means for interconnecting the crossing lines in which signal flow may be in either direction. Small triangles at intersections indicate programmable connections at the crossing lines in which signal flow is onto the line pointed to by the tip of the triangle. Possible interconnection means include pass transistors, EPROM cells, or antifuses. In one embodiment using pass transistors, the gates of these transistors are controlled by memory cells or latches. In this embodiment, tiles above and below tile 105 have identical structures, but differ in the number of pad interconnections provided. Lines LV0 through LV7 are long lines extending from one interface tile 105 to the next, whereas lines N0 through N7 are short lines for connecting to lines S0 through S7, respectively, in adjacent tiles. Lines LH0 through LH7 provide long line connections through several tiles such as T11, T21, and T31 (FIGS. 1A or 1B) to the left while lines such as W1 through W11 connect to the next adjacent tile to the left, such as T11. Thus, pads connected to interface structure 105 can be connected by interface structure 105 either to tiles to the left or to tiles above and below interface structure 105.

Thus, the present invention significantly simplifies forming different sizes of integrated circuit devices. Specifically, changing number of pad connections to the logic elements or tiles requires changes only in the interface structure of FIG. 3. Thus, any number pads in this embodiment up to four, are selectively connected to any one interface structure 105. Significantly, no redesign of the interior of the chip is required beyond changing the number of logic elements included.

In light of the above description, many other embodiments of this invention can be envisioned by those skilled in the art.

The present invention is set forth in the appended claims. I claim:

1. A layout of an integrated circuit chip comprising:

a plurality of input/output blocks positioned around the perimeter of said integrated circuit chip;

a core logic region positioned away from said perimeter;

an interface region positioned between said plurality of input/output blocks and said core logic region, said interface region including first lines connectable to said core logic region and extending into said input/output blocks, and second lines connectable to said core logic region, pairs of said second lines being connected together in said interface region, each line of said pair of second lines being connectable to the same portions of said core logic region as one of said first lines;

whereby said integrated circuit chip layout can be replaced by an integrated circuit chip layout having a smaller core logic region by decreasing the number of said input/output blocks positioned around the perimeter and altering said interface region to replace pairs of said first lines with pairs of said second lines.

* * * * *